(12) United States Patent
Chu et al.

(10) Patent No.: US 8,926,745 B2
(45) Date of Patent: Jan. 6, 2015

(54) METHOD FOR PREPARING LOW K MATERIAL AND FILM THEREOF

(75) Inventors: Cheng-Jye Chu, Kaohsiung (TW); Chih-Hung Chen, Kaohsiung (TW)

(73) Assignee: Nanmat Technology Co., Ltd., Kaohsiung (TW)

( * ) Notice: Subject to any disclaimer, the term of this patent is extended or adjusted under 35 U.S.C. 154(b) by 217 days.

(21) Appl. No.: 13/242,315

(22) Filed: Sep. 23, 2011

(65) Prior Publication Data

US 2012/0118204 A1    May 17, 2012

(30) Foreign Application Priority Data

Nov. 17, 2010   (TW) .............................. 99139585 A (51) Int. Cl.

| | | |
|---|---|---|
| C04B 28/26 | (2006.01) | |
| C09J 11/06 | (2006.01) | |
| H05H 1/24 | (2006.01) | |
| H01L 21/00 | (2006.01) | |
| C23C 16/40 | (2006.01) | |
| C23C 16/505 | (2006.01) | |
| C23C 16/56 | (2006.01) | |

(52) U.S. Cl.
CPC ............. C23C 16/401 (2013.01); C23C 16/505 (2013.01); C23C 16/56 (2013.01)
USPC .................. 106/287.34; 106/287.28; 427/579; 427/578; 438/710

(58) Field of Classification Search
None
See application file for complete search history.

(56) References Cited

U.S. PATENT DOCUMENTS

| | | | | |
|---|---|---|---|---|
| 7,056,560 | B2 * | 6/2006 | Yim et al. ...................... | 427/551 |
| 7,060,330 | B2 * | 6/2006 | Zheng et al. .................. | 427/551 |
| 7,422,774 | B2 * | 9/2008 | Zheng et al. .................. | 427/551 |
| 7,432,210 | B2 * | 10/2008 | Wang et al. .................... | 438/710 |
| 7,473,653 | B1 * | 1/2009 | Wu et al. ........................ | 438/781 |
| 7,500,397 | B2 * | 3/2009 | Weigel et al. ................... | 73/714 |
| 7,611,996 | B2 | 11/2009 | Schmitt et al. | |
| 7,618,889 | B2 | 11/2009 | Naik | |
| 7,642,204 | B2 * | 1/2010 | Srinivasan et al. ............ | 438/789 |
| 7,695,765 | B1 * | 4/2010 | Fox et al. ................. | 427/255.37 |
| 7,799,705 | B1 * | 9/2010 | Wu et al. ....................... | 438/781 |

OTHER PUBLICATIONS

Takashi Usami, Kimiaki Shimokawa, and Masaki Yoshimaru, "Low Dielectric Constant Interlayer Using Fluorinated-Doped Silicon Oxide", Jan. 1994, pp. 408-412, vol. 33, *Japanese Journal of Applied Physics*, Japan.

(Continued)

*Primary Examiner* — Guinever Gregorio
(74) *Attorney, Agent, or Firm* — Muncy, Geissler, Olds & Lowe, P.C.

(57) ABSTRACT

A method for preparing a low dielectric constant (low k) material and a film thereof is provided. The method includes the following steps. A substrate is first put into a plasma generating reaction system, and a carrier gas carrying a carbon and fluorine containing silicon dioxide precursor is then introduced into the plasma generating reaction system, so that the carbon and fluorine containing silicon dioxide precursor is formed on the substrate. After that, the carbon and fluorine containing silicon dioxide precursor is converted to a low k material film through heating; meanwhile, a stress of the low k material film is eliminated such that the film has a more compact structure. By means of these steps the carbon and fluorine containing silicon dioxide precursor is still capable of forming a low k material film of silicon dioxide containing a large amount of fluorocarbon, even under various different atmospheres.

9 Claims, 8 Drawing Sheets

(56) References Cited

OTHER PUBLICATIONS

Sang Woo Lim, Yukihiro Shimogaki, Yoshiaki Nakano, Kunio Tada and Hiroshi Komiyama, "Reduction Mechanism in the Dielectric Constant of Fluorine-Doped Silicon Dioxide Films", Jul. 1997, pp. 2531-2537, vol. 144, *Journal of The Electrochemical Society*, USA.

Han, Sang M., Aydil, Eray S. "Structure and chemical composition of fluorinated $SiO_2$ films deposited using $SiF_4/O_2$ plasmas", Nov. 1997, pp. 2893-2904, vol. 15, *Journal of Vacuum Science & Technology*, USA.

\* cited by examiner

METHOD FOR PREPARING LOW K MATERIAL AND FILM THEREOF

CROSS-REFERENCES TO RELATED APPLICATIONS

This non-provisional application claims priority under 35 U.S.C. §119(a) on Patent Application No. 99139585 filed in Taiwan, R.O.C. on 2010 Nov. 17, the entire contents of which are hereby incorporated by reference.

BACKGROUND OF THE INVENTION

1. Field of Invention

The present invention relates to a method for preparing a low k material and a film thereof, and more particularly to a method for preparing a low k material of silicon oxide containing a large amount of fluorocarbon and a film thereof. The method is applicable to a low k material in an ultra-large-scale-integration (ULSI) circuit manufacturing process and a preparation method thereof.

2. Related Art

In recent years, designers and manufacturers of large-scale-integration (LSI) circuits have continuously designed and manufactured micro scale devices, for the purpose of increasing a package density of a semiconductor chip, improving a work speed of a component, and adding relevant functions. Therefore, after a gate length of a transistor is reduced to less than 0.13 um, the number and density of interconnections on each chip of an ultra-large-scale-integration (ULSI) circuit are greatly increased. When interconnected wires between the chips, including the inter-layer and intra-layer interconnected wires, become smaller and are spaced more compactly, a small conductor volume will increase resistivity (R) of the metal wire, and smaller inter-wire and inter-layer intervals will increase a capacitance (C) between the wires. An RC delay caused by the R and C becomes an increasing part in an overall signal delay of a circuit, neutralizing any speed advantage resulting from the small device size. Therefore, the use and development of a low R metal (such as copper) will continuously reduce the R of the interconnected wires. On the other hand, capacitance can be reduced using a dielectric material with a low k. Fluorine-doped silicon oxide film is a low k film.

Current fluorine-doped silicon oxide film is generally fabricated using tetraethoxysilane (TEOS) and silane as precursors, and adding a $C_nF_{2n+2}$ or a $Si_nF_{2+2}$ gas as a source of fluorine into a plasma enhanced chemical vapor deposition (PECVD) manufacturing process, in which the source for deposition of fluorocarbon needs two or more precursors. It is disclosed in a literature such as [Low Dielectric Constant Interlayer Using Fluorinated-Doped Silicon Oxide, Jpn. J. Appl. Phys. 33, 408 (1994).] published by Usami et al. that $C_2F_6$ gas is added into $TEOS/O_2$ to form a low k material. In addition, [Reduction Mechanism in the Dielectric Constant of Fluorine-Doped Silicon Dioxide Films, J. Electrochem. Soc. 144, 2531 (1997)] published by Lim et al. discloses that $CF_4$ is added into $SiH_4/N_2O$ to form a low k material. Moreover, [Structure and Chemical Composition of Fluorinated $SiO_2$ Film Deposited Using $SiF_4/O_2$ Plasma, J. Vac. Sci. Technol. A15, 2893 (1997)] published by Han et al. discloses that $SiF_4$ is added into a $SiH_4/O_2$ system to form a low k material. These low k materials containing fluorocarbon all require two or more precursors to act as the source for the deposition of fluorocarbon.

Since $SiF_4$ gas is hard to dissociate, a dual frequency plasma enhanced chemical vapor deposition (DF-PECVD) method or a electron cyclotron resonance chemical vapor deposition (ECRCVD) method are usually employed in the industry to enhance the dissociation of the gas material, and a ratio of unstable Si—$F_2$ bonds in the film is lowered through ion bombardment on a surface of the film. However, these two equipment systems disclosed are very costly, and are therefore inappropriate for mass production in commercial applications.

U.S. Pat. No. 7,611,996 entitled "Multi-stage curing of low K nano-porous films" discloses a thermal treatment method for adjusting, for example, heat resistance and water resistance of a low k film. However, the patent does not disclose a best structural composition of the low k material film that may contain fluorocarbon long chains and a corresponding thermal treatment method.

Furthermore, U.S. Pat. No. 7,618,889 entitled "Dual damascene fabrication with low k materials" discloses a method for preparing a low k material, but does not disclose in detail a composition and a post-treatment method for improving the heat resistance and water resistance of the low k material.

To overcome the disadvantages described previously, the applicants invent, through careful researches and experiments, a method for preparing a low k material of silicon dioxide containing fluorocarbon and a film thereof. U.S. Pat. Nos. 7,611,996 and 7,618,889 are used as cited references in the present invention.

SUMMARY OF THE INVENTION

The present invention is directed mainly to a method for preparing a low k material film, by which a low k material film of silicon dioxide containing a large amount of fluorocarbon is deposited using a single carbon and fluorine containing silicon dioxide precursor alone, and the prepared low k material film contains a large number of fluorocarbon long chains, which is capable of improving heat resistance and water resistance of the low k material and applicable to a low k manufacturing process in a ULSI circuit manufacturing process.

The present invention is further directed to a low k material, in which a low k material film of silicon dioxide containing a large amount of fluorocarbons can be prepared using a single carbon and fluorine containing silicon dioxide precursor alone, which is applicable to a low k manufacturing process in a ULSI circuit manufacturing process.

To achieve this main objective, the present invention provides a method for preparing a low k material film, which includes: putting a substrate into a plasma generating reaction system; introducing a carrier gas carrying a carbon and fluorine containing silicon dioxide precursor into the plasma generating reaction system, and forming the carbon and fluorine containing silicon dioxide precursor on a surface of the substrate; converting the carbon and fluorine containing silicon dioxide precursor into a low k material film, and eliminating a stress of the low k material film, such that the film has a more compact structure. A carbon content of the low k material film ranges from 10% to 50%, and a fluorine content ranges from 10% to 40%.

To achieve this further objective, the present invention provides a low k material, which is mainly a fluorocarbon containing silicon dioxide, and formed from a single carbon and fluorine containing silicon dioxide precursor through thermal treatment. A carbon content of the low k material ranges from 10% to 50%, a fluorine content ranges from 10% to 40%, and a dielectric constant ranges from 2.2 to 2.8.

A chemical formula of the functional group for the carbon and fluorine containing silicon dioxide precursor of the present invention is $C_xH_yF_z$, in which x ranges from 5 to 20, and z ranges from 3 to 15; and the carbon and fluorine containing silicon dioxide precursor includes $R_1Si(OR_2)(OR_3)(OR_4)$, tridecafluoro-1,1,2,2-tetrahydrooctyl-truethoxysilane (TDF-TEOS) and trimethoxy (3,3,3-trifluoropropyl) silane, in which $R_1$ is one of fluoroalkyl, fluoroalkenyl, fluoroalkynyl and fluoroaryl, and $R_2$, $R_3$ and $R_4$ are one of alkyl, methyl, ethyl, aryl, alkenyl and alkynyl.

To sum up, the method for preparing a low k material and a film thereof disclosed in the present invention has the following effects.

1. The carbon and fluorine containing silicon dioxide precursor containing a large amount of carbon and fluorine can be deposited with an organic silicon oxide material containing a fluorocarbon long chains at a low-temperature.

2. The low k material film of silicon dioxide containing a large amount of fluorocarbon is deposited using a single carbon and fluorine containing silicon dioxide precursor alone.

3. The stress of the low k material film of silicon dioxide containing fluorocarbon can be eliminated and the structure thereof is compacted considerably, through the thermal treatment process, so as to improve a mechanical strength of the film.

BRIEF DESCRIPTION OF THE DRAWINGS

To make the above and other objectives, features and advantages of the present invention more comprehensible, preferred embodiments of the present invention are described in detail below with reference to the accompanying drawings, in which.

DETAILED DESCRIPTION OF THE INVENTION

Although the present invention may be implemented with different forms of embodiments, the ones shown in the drawings and described below are preferred embodiments of the present invention. It should be noted that the embodiments disclosed are only regarded as examples of the present invention, and not intended to limit the present invention to the drawings and/or specific embodiments described.

A deposition system for depositing a low k material of silicon dioxide containing fluorocarbon may be one of an atom layer deposition (ALD) and a chemical vapor deposition (CVD).

Figure 1:
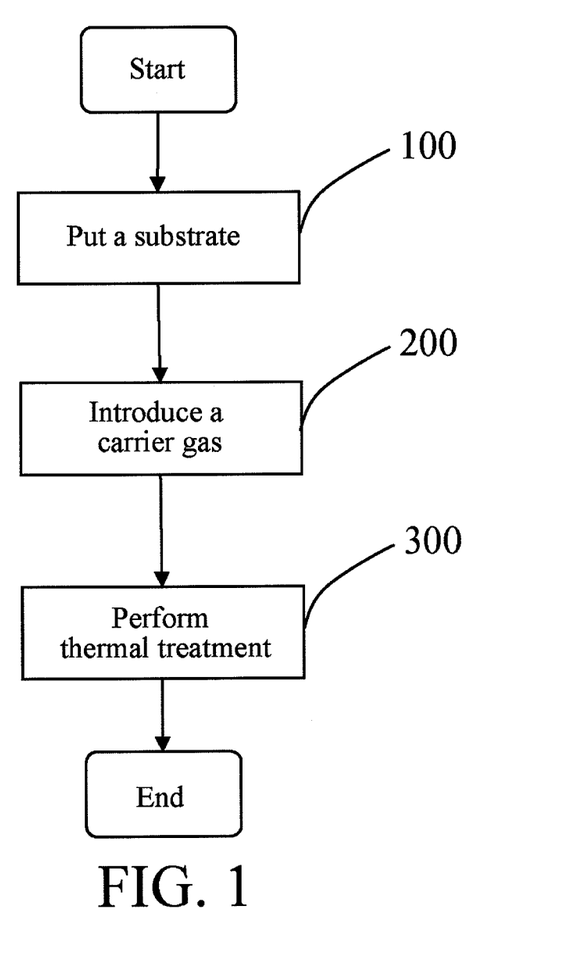
FIG. 1 is a flow chart of a method for preparing a low k material film of the present invention.

FIG. 1 is a flow chart of a method for preparing a low k material film of the present invention, which includes the following steps.

In Step 100, a substrate is put.

In this step, a substrate is put into a plasma generating reaction system, in which the substrate is one of a silicon substrate, a silicon dioxide substrate, a metal substrate, a gallium arsenide substrate, a printed circuit board, a sapphire substrate, and a metal nitride substrate. However, when applied in a low k material in a ULSI circuit manufacturing process, the substrate is preferably a silicon substrate. In addition, the plasma generating reaction system may be any vacuum coating system capable of supporting a substrate, and preferably, a vapor deposition system, for example, CVD, PEDVD or ECRVCD, or ALD is used. The CVD process used in the present invention is as follows. A gas or a vapor source material is introduced into a reaction chamber, and coated onto a surface of the substrate through adsorption when the source material diffuses and penetrates an interface layer and contacts the surface of the substrate. Then, the adsorbed source material moves, and begins to experience a chemical reaction on the surface of the substrate. Finally, crystal nucleus of a solid product are form on the surface of the substrate, and grow into islands, and then the islands are combined into a successive film. The ALD process is described as follows. A chemical adsorption reaction of a process gas with a surface of the material is performed. Since the reaction has a self-limited property, a film with only one layer of atom in thickness is formed in per pass of gas-in cycle, and this feature makes a control accuracy for the thickness of the coated film reach an atomic level (about one-tenth of a nanometer). Compared with a conventional film preparation process, the growing process of the film formed by the ALD technology is limited on the surface of the material, such that the film has a high step coverage rate and excellent thickness uniformity. In a preferred embodiment, the plasma generating reaction system of the present invention is a PECVD system. In the preparation process, a radio frequency power thereof ranges from 3 to 1000 W, and when the substrate is put, a temperature in the plasma generating reaction system ranges from 100 to 300° C., so as to shorten the time for polymerizing the carbon and fluorine containing silicon dioxide precursor into the low k material film.

In Step 200, a carrier gas is introduced.

In this step, a carrier gas is introduced into the plasma generating reaction system, in which the carrier gas is used for carrying the carbon and fluorine containing silicon dioxide precursor, and the carbon and fluorine containing silicon dioxide precursor is formed on the substrate.

The carrier gas may be one selected from a reductive gas participating in the reaction and an inert gas not participating in the reaction. When the carrier gas is a reduction gas participating in the reaction, the carrier gas is one selected from silane vapor, oxygen, air and oxy-hydrogen; and when the carrier gas is an inert gas not participating in the reaction, the carrier gas is one selected from nitrogen, helium and argon.

A chemical formula of the carbon and fluorine containing silicon dioxide precursor is $C_xH_yF_z$, in which x ranges from 5 to 20, and z ranges from 3 to 15. More specifically, the carbon and fluorine containing silicon dioxide precursor is composed of $R_1Si(OR_2)(OR_3)(OR_4)$, tridecafluoro-1,1,2,2-tetrahydrooctyl-truethoxysilane (TDF-TEOS) and trimethoxy (3,3,3-trifluoropropyl) silane, in which $R_1$ is one of fluoroalkyl, fluoroalkenyl, fluoroalkynyl and fluoroaryl, and $R_2$, $R_3$ and $R_4$ are one of alkyl, fluoroalkyl, fluoroaryl, fluoroalkenyl and fluoroalkynyl.

In a preferred embodiment, when the carrier gas is introduced, the carbon and fluorine containing silicon dioxide precursor is heated at a temperature ranging from 50 to 100° C., such that the carbon and fluorine containing silicon dioxide precursor has a more stable vapor pressure. In addition, a flow rate of the carrier gas ranges from 0.1 to 10000 sccm, which can effectively reduce a water vapor transmission rate, and make a saturated vapor pressure of the carbon and fluorine containing silicon dioxide precursor in the range of 30 to 80 torr. The time for introducing the carrier gas ranges from 0.5 to 1.5 hours.

In Step 300, thermal treatment is performed.

In this step, the carbon and fluorine containing silicon dioxide precursor is converted into a low k material film of silicon dioxide containing fluorocarbon and a stress of the low k material film is eliminated, through thermal treatment, such that the film has a more compact structure. A carbon content of the low k material film of silicon dioxide containing fluorocarbon ranges from 10 to 50%, and a fluorine content ranges from 10 to 40%.

The thermal treatment includes raising the temperature of the carbon and fluorine containing silicon dioxide precursor, or providing an additional energy to the precursor. The extra energy may come from a magnetic field or other light sources, for example, an additional infrared or laser system installed in the plasma generating reaction system. In a preferred embodiment, the carbon content of the low k material film of silicon dioxide containing fluorocarbon formed through thermal treatment ranges from 10 to 50%, and the fluorine content ranges from 10 to 40%.

Figure 2:
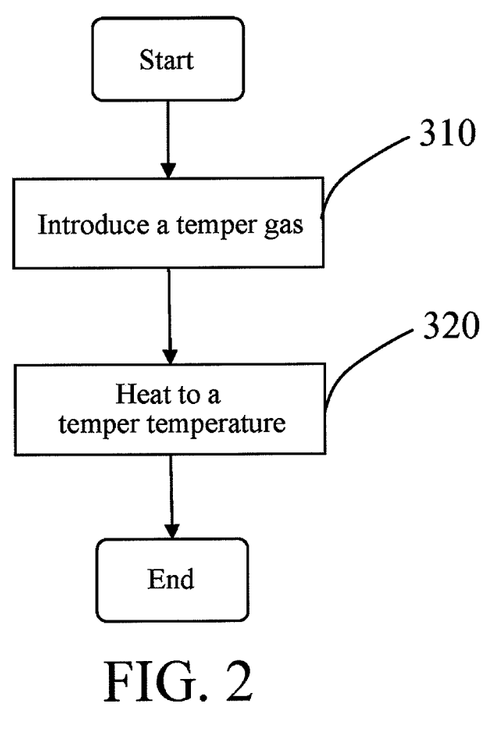
FIG. 2 is a flow chart of a tempering process of a low k material film of the present invention.

FIG. 2 is a flow chart of a tempering process of a low k material film of the present invention, which includes the following steps.

In Step 310, a temper gas is introduced.

In this step, the temper gas is introduced at a flow rate ranging from 0.1 to 10000 sccm, and is used to react with the low k material film of silicon dioxide containing fluorocarbon. The temper gas is one of the group consisting of nitrogen, hydrogen, oxygen, ammonia, fluorinated ammonia, silane vapor, helium and argon.

In Step 320, heating to a temper temperature is performed.

In this step, thermal treatment is performed on the carbon and fluorine containing silicon dioxide precursor by heating to a temperature ranging from 300 to 500° C., so that the time needed for conversion is shorten, and a high carbon to fluorine ratio is maintained in the low k material film of silicon dioxide containing fluorocarbon.

In a preferred embodiment, a substrate is put into a plasma generating reaction system first, and a molecular turbine pump is used to suction a chamber to a background pressure. The background pressure of a deposition system ranges from $2\times10^{-4}$ to $2\times10^{-6}$ torr, and a preferred background pressure is $2\times10^{-5}$ torr. After being suctioned to the background pressure, the substrate is heated to 175° C. It should be noted that, the carbon and fluorine containing silicon dioxide precursor is disposed in an evaporator, and needs to be heated to a temperature ranging from 50 to 100° C., and preferably 80° C. During the heating process, a saturated pressure of the carbon and fluorine containing silicon dioxide precursor in the evaporator should be maintained at 50 torr.

Embodiment (1)

In Embodiment (1), the used carrier gas is argon at a flow rate controlled at 14 sccm; and a radio frequency power of a plasma generating reaction system is adjusted at 500 to 1000 W. A temperature of a substrate is 175° C., and the radio frequency power of the plasma generating reaction system is 3 W. When the radio frequency power of the plasma generating reaction system is controlled at 3 W or above, the gas is excited to form plasma. After the plasma is stable, the carrier gas carrying the carbon and fluorine containing silicon dioxide precursor is introduced into the plasma generating reaction system. After plasma dissociation and thermal treatment, a low k material film of silicon dioxide containing fluorocarbon is deposited on a surface of the substrate. The deposition time is preferably 1 hour. During the deposition of the low k material film of silicon dioxide containing fluorocarbon, oxygen is introduced. The deposition is performed under oxygen atmospheres having different flow rates of 0.2 sccm, 0.4 sccm, 0.6 sccm, 0.8 sccm and 1.0 sccm, and the flow rate of oxygen is most preferably 0.4 to 0.6 sccm.

Figure 3:
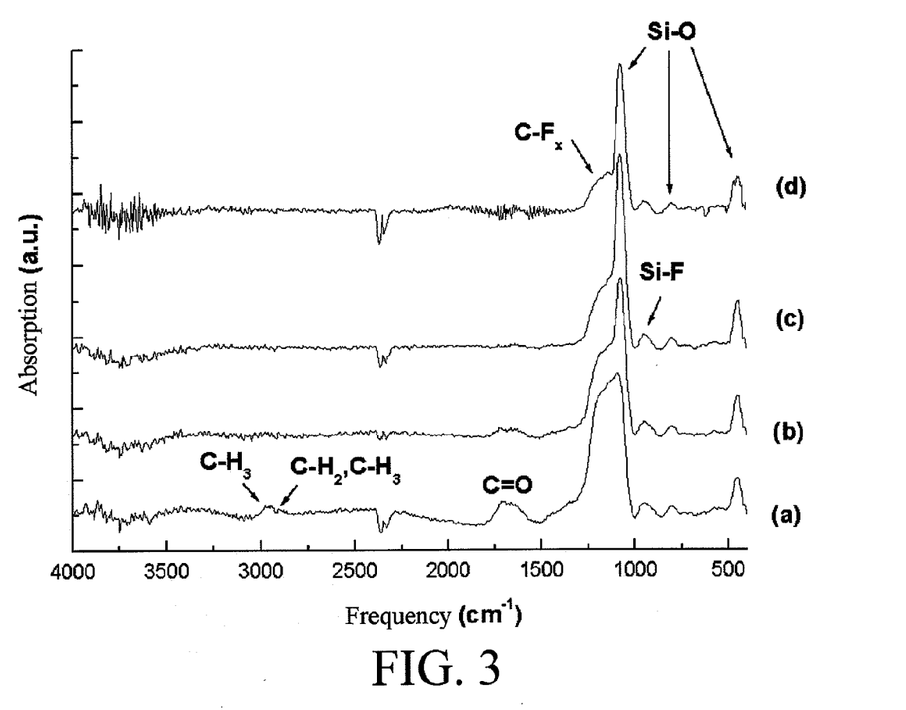
FIG. 3 is a Fourier transform infrared spectrum of a low k material before a thermal treatment process.

FIG. 3 is a Fourier transform infrared spectrum of a low k material before a thermal treatment process, in which the gas-oxygen flow rates are (a) 0.2 scccm, (b) 0.4 sccm, (c) 0.6 sccm and (d) 1 sccm. As shown in FIG. 3, rocking, bending and stretching vibration absorption peaks of Si—O appear respectively at frequencies of 450, 810, and 1070 $cm^{-1}$. A C—$F_x$ bond absorption peak appears at a frequency of 1100 to 1210 $cm^{-1}$, and a Si—$F_x$ bond absorption peak appears at 940 $cm^{-1}$. The occurrence of the two bonds indicates that the film has silicon-fluorine/carbon-fluorine bonds. Under a low oxygen flow rate, the film has C—H2, C—H3 and C=O bond absorption peaks appeared at the frequencies of 2930, 2955 and 1690 $cm^{-1}$; however, as the oxygen flow rate increases, the absorption peaks tend to be smaller, which indicates that the added amount of oxygen helps to remove the silicon-fluorine bond, carbon-hydrogen bond and C=O bond through reaction in film growth, and the occurrence of the C=O bond shows that the C=O bond is left over due to the incomplete reaction of the organic components and oxygen.

Figure 4:
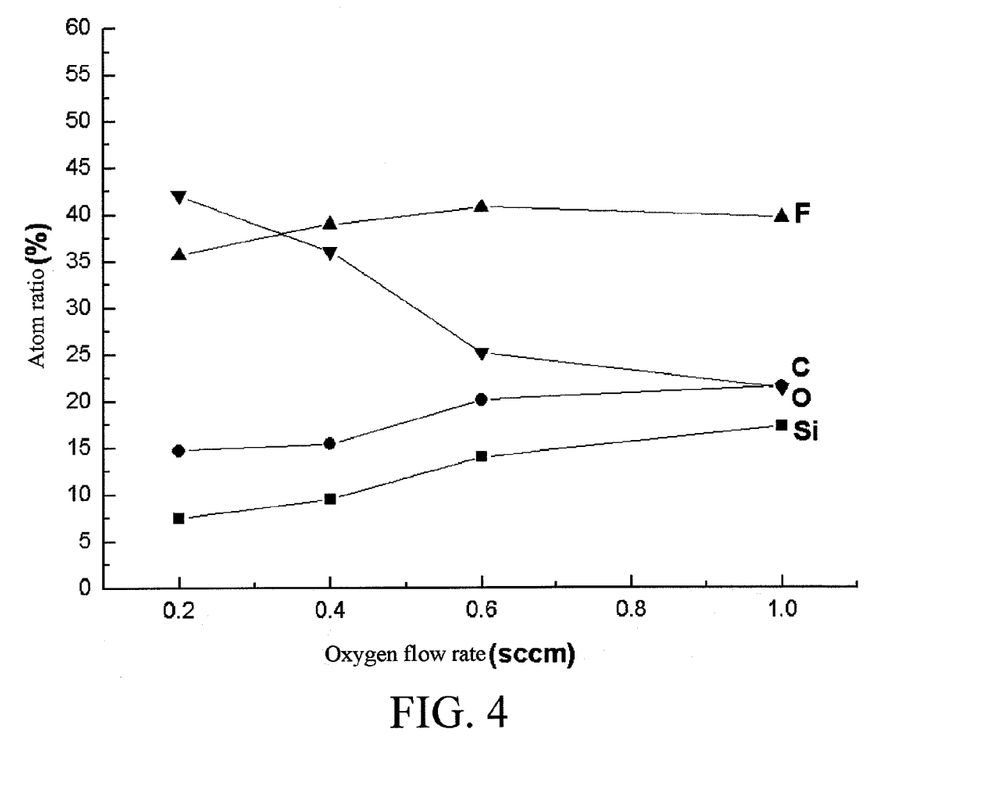
FIG. 4 shows a component ratio of fluorine, carbon, oxygen and silicon in a low k material film before a temper gas is introduced.

FIG. 4 shows a component ratio of fluorine, carbon, oxygen and silicon in a low k material film before a temper gas is introduced. Before a temper gas is introduced, a relation between an atom ratio of Si, O, C, and F in the film and the added amount of oxygen can be calculated through integration of an X-ray photoelectron spectrum.

Figure 5:
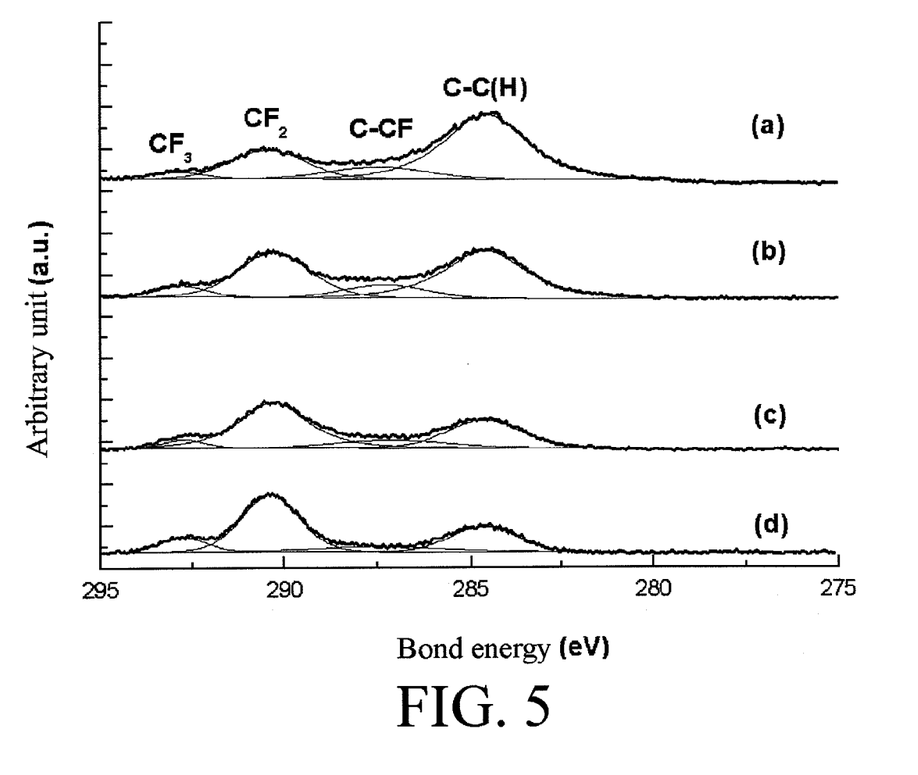
FIG. 5 is an X-ray photoelectron spectrum of a low k material film before a temper gas is introduced.

FIG. 5 is an X-ray photoelectron spectrum of a low k material film before a temper gas is introduced. An 1 s energy spectrum showing a peak resolution result of a film before the temper gas is introduced can be obtained from FIG. 5, and the gas-oxygen flow rates respectively are (a) 0.2 sccm, (b) 0.4 sccm, (c) 0.6 sccm and (d) 1 sccm.

Figure 6:
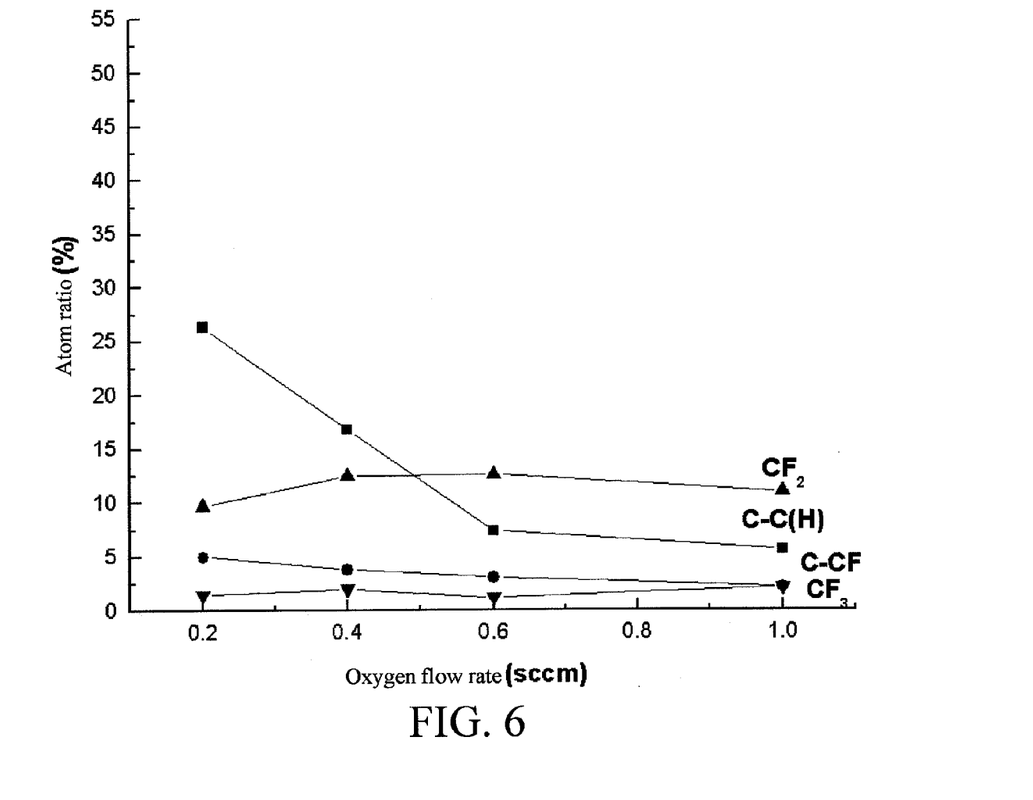
FIG. 6 is an X-ray energy spectrum showing a component ratio of a low k material film before a temper gas is introduced.

FIG. 6 is an X-ray energy spectrum showing a component ratio of a low k material film before a temper gas is introduced. By introducing the gas-oxygen at different flow rates into the plasma generating reaction system, a 1 s orbital of the carbon element and changes in ratio of the components in the low k material film of silicon dioxide containing fluorocarbon can be found. Before the temper gas is introduced, it can be obviously seen through the above analysis views that the low k material film of silicon dioxide containing fluorocarbon contains a quite large amount of component fluorocarbon containing silicon dioxide.

Finally, the low k material film formed with the carbon and fluorine containing silicon dioxide precursor is put in the temper gas, and a tempering process is performed. During introduction of the temper gas, the low k material film formed with the carbon and fluorine containing silicon dioxide precursor is heated at a temperature ranging 300 to 500° C., while the introduction of the carrier gas is stopped.

Figure 7:
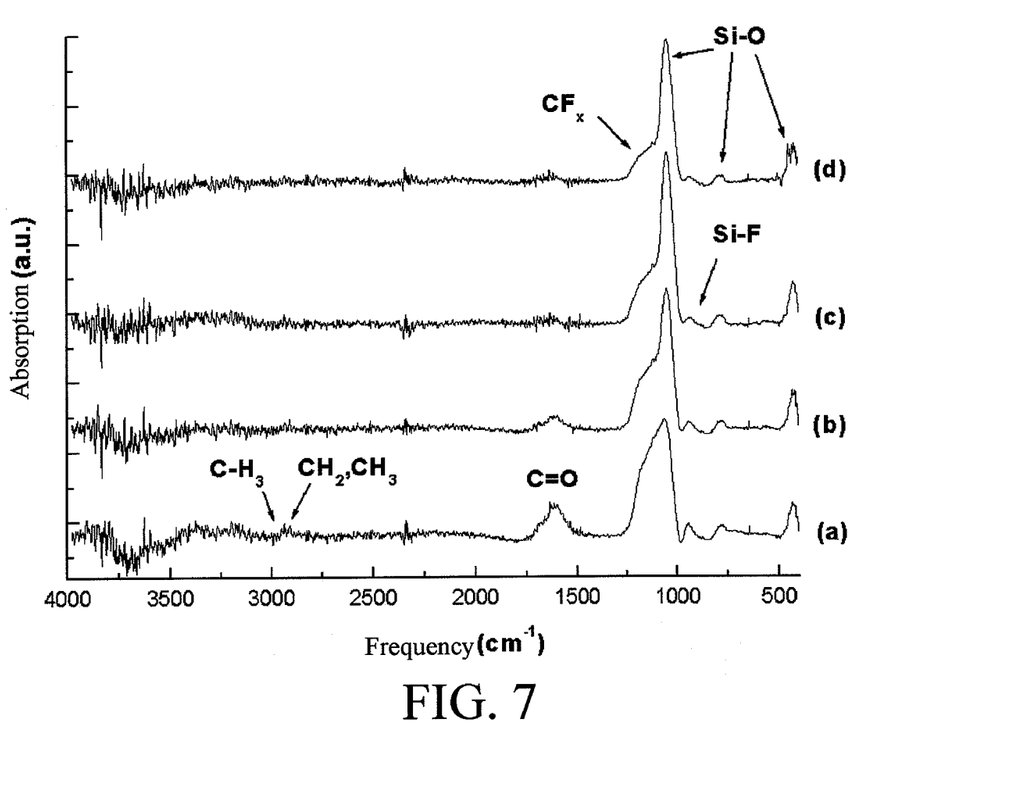
FIG. 7 is a Fourier transform infrared spectrum of a low k material of the present invention after a tempering process.

FIG. 7 is a Fourier transform infrared spectrum of a low k material of the present invention after a tempering process. The low k material film of silicon dioxide containing fluorocarbon is deposited under the gas-oxygen at different flow rates of (a) 0.2 sccm, (b) 0.4 sccm, (c) 0.6 sccm and (d) 1 sccm. The tempering process of the low k material film of silicon dioxide containing fluorocarbon includes introducing 200 sccm of nitrogen, and tempering at a temperature of 400° C. for 1 hour, in which the temper time preferably ranges from 0.5 to 1.5 hours.

Figure 8:
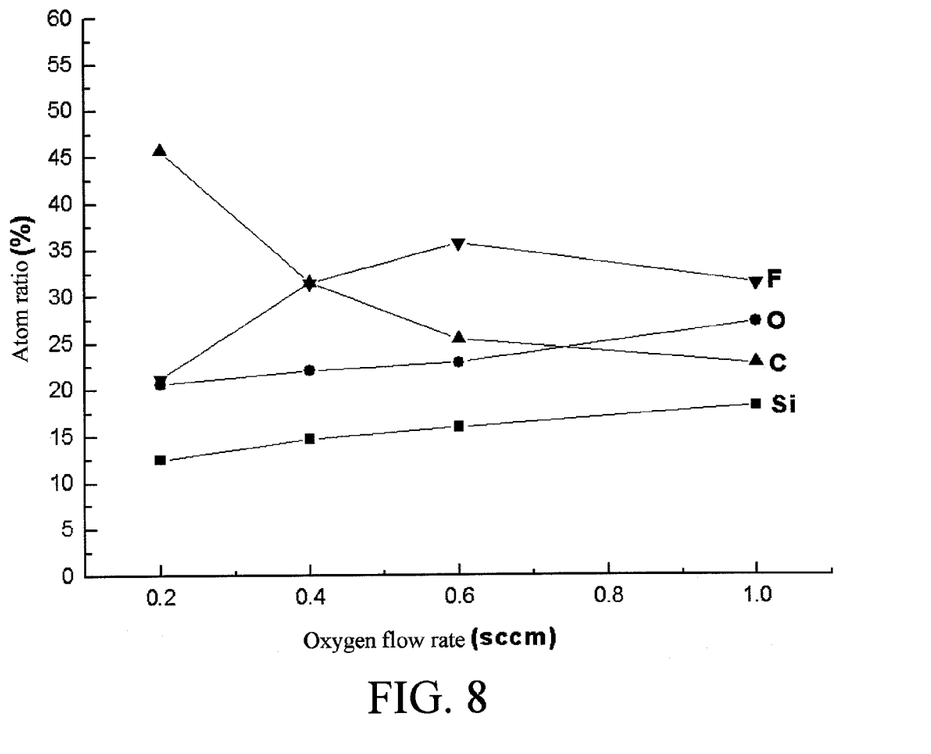
FIG. 8 is a component ratio of fluorine, carbon, oxygen and silicon in a low k material film of the present invention after a tempering process.

FIG. 8 shows a component ratio of fluorine, carbon, oxygen and silicon in a low k material film of the present invention after a tempering process. After the gas-oxygen is introduced into the plasma generating reaction system at different flow rates, and after the thermal treatment process is performed, a relation between the ratio of Si, O, C and F in the low k material film of silicon dioxide containing fluorocarbon and the added amount of oxygen can be calculated through integration of the X-ray photoelectron spectrum. It can be seen that after the thermal treatment process, the low k material film of silicon dioxide containing fluorocarbon still contains a quite large amount of component fluorocarbon containing silicon dioxide. Apparently, a carbon content of the low k material film of silicon dioxide containing fluorocarbon ranges from 10 to 50%, and a fluorine content ranges from 10 to 40%.

Embodiment (2)

Process parameters of Embodiment (2) are substantially similar to those in Embodiment (1). The main differences are illustrated as follows. A radio frequency power of a plasma generating reaction system is 6 W; flow rates of a diluting gas-oxygen are respectively (a) 0.2 sccm, (b) 0.4 sccm, (c) 0.6 sccm and (d) 1 sccm; and when a carbon and fluorine containing silicon dioxide precursor is deposited, a temperature of a substrate is 175° C. A relation between the flow rate of the diluting gas-oxygen and each carbon bond in a low k material film of silicon dioxide containing fluorocarbon is as shown in Table 1 (before a tempering process).

TABLE 1

Relation between the flow rate of the diluting gas-oxygen and each carbon bond in the low k material of silicon dioxide containing fluorocarbon (the radio frequency power is 6 W)

| $O_2$ (sccm) | C—C(H) (%) | C—CF (%) | $CF_2$ (%) | $CF_3$ (%) |
|---|---|---|---|---|
| 0.2 | 27.2 | 5.3 | 8.7 | 0.6 |
| 0.4 | 16.7 | 5.0 | 12.3 | 2.2 |
| 0.6 | 9.0 | 3.4 | 12.9 | 2.0 |
| 1.0 | 4.8 | 2.3 | 11.7 | 2.2 |

Embodiment (3)

Process parameters of Embodiment (3) are substantially similar to those in Embodiment (1). The main differences are illustrated as follows. A radio frequency power of a plasma generating reaction system is 30 W; flow rates of a diluting gas-oxygen are respectively (a) 0.2 sccm, (b) 0.4 sccm, (c) 0.6 sccm and (d) 1 sccm; and when a carbon and fluorine containing silicon dioxide precursor is deposited, a temperature of a substrate is 175° C. A relation between the flow rate of the diluting gas-oxygen and each carbon bond in a low k material film of silicon dioxide containing fluorocarbon is as shown in Table 2 (before a tempering procedure).

TABLE 2

Relation between the flow rate of the diluting gas-oxygen and each carbon bond in the low k material film of silicon dioxide containing fluorocarbon (the radio frequency power is 30 W)

| $O_2$ (sccm) | C—C(H) (%) | C—CF (%) | $CF_2$ (%) | $CF_3$ (%) |
|---|---|---|---|---|
| 0.2 | 51.5 | 8.8 | 1.0 | 0 |
| 0.4 | 42.3 | 7.3 | 3.4 | 0.7 |
| 0.6 | 30.5 | 6.5 | 4.1 | 0.9 |
| 1.0 | 47.5 | 2.6 | 3.6 | 0.8 |

Embodiment (4)

Process parameters of Embodiment (4) are substantially similar to those in Embodiment (1). The main differences are illustrated as follows. Flow rates of a diluting gas-oxygen are respectively (a) 0.2 sccm, (b) 0.4 sccm, (c) 0.6 sccm and (d) 1 sccm; when a carbon and fluorine containing silicon dioxide precursor is deposited, a temperature of a substrate is 175° C.; and a radio frequency power of a plasma generating reaction system is 6 W. A relation between a tempering process and a change of each component in a low k material film of silicon dioxide containing fluorocarbon is as shown in Table 3. It should be noted that the tempering process conditions of the low k material film of the silicon dioxide containing fluorocarbon in Embodiment (4) are that nitrogen is used as a temper gas, a tempering temperature is 400° C. and tempering time is 1 hour. Apparently, a carbon content of the low k material film of silicon dioxide containing fluorocarbon is 10 to 50%, and a fluorine content is 10 to 40%.

TABLE 3

Relation between a tempering process and a change of each component in the low k material film of silicon dioxide containing fluorocarbon (the radio frequency power is 6 W)

| $O_2$ (sccm) | Si (%) | O (%) | C (%) | F (%) |
|---|---|---|---|---|
| 0.2 | 12.8 | 23.8 | 44.4 | 19.2 |
| 0.4 | 15.8 | 24.2 | 32.1 | 27.8 |
| 0.6 | 17.3 | 24.9 | 22.2 | 35.6 |
| 1.0 | 21.5 | 30.6 | 16.1 | 31.8 |

To summarize, the method for preparing a low k material and a film thereof disclosed in the present invention has the following effects.

1. The carbon and fluorine containing silicon dioxide precursor containing a large amount of carbon and fluorine can be deposited with an organic silicon oxide material containing a fluorocarbon long chain at a low-temperature.

2. The low k material film of silicon dioxide containing a large amount of fluorocarbon is deposited using a single carbon and fluorine containing silicon dioxide precursor alone.

3. The stress of the low k material film of silicon dioxide containing fluorocarbon can be eliminated and the structure thereof is compacted considerably, through the thermal treatment process, so as to improve a mechanical strength of the film.

While the present invention has been described by the way of example and in terms of the preferred embodiments, it is to be understood that the invention need not to be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for preparing a low dielectric constant (low k) material film, comprising:
   putting a substrate into a plasma generating reaction system, wherein a first temperature in the plasma generating reaction system ranges from 100 to 300° C.;
   heating a single silicon dioxide precursor comprising carbon and fluorine disposed in an evaporator to a second temperature ranging from 50 to 100° C. to be a gaseous phase with a vapor pressure in the range of 30 to 80 torr;
   introducing a carrier gas, carrying the single silicon dioxide precursor comprising carbon and fluorine alone, into the plasma generating reaction system, and forming the silicon dioxide precursor comprising carbon and fluorine on the substrate, wherein the carrier gas is one selected from oxygen and argon; and
   converting the silicon dioxide precursor comprising carbon and fluorine into a low k material film with fluorocarbon long chains consisting of a C—$F_x$ bond, and eliminating a stress of the low k material film through a thermal treatment by providing an additional energy to the silicon dioxide precursor comprising carbon and fluorine, so that the low k material film has a compact structure;
   wherein the silicon dioxide precursor comprising carbon and fluorine is $R_1Si(OR_2)(OR_3)(OR_4)$, tridecafluoro-1,1,2,2-tetrahydrooctyl-triethoxysilane (TDF-TEOS), and trimethoxy (3,3,3-trifluoropropyl) silane, in which $R_1$ is one of fluoroalkyl, fluoroalkenyl, fluoroalkynyl and fluoroaryl, and $R_2$, $R_3$ and $R_4$ are one of alkyl, methyl, ethyl, aryl, alkenyl and alkynyl;
   a carbon atom ratio content of the low k material film ranges from 10 to 50% and a fluorine atom ratio content ranges from 10 to 40%.

2. The method for preparing the low k material film according to claim 1, wherein the plasma generating reaction system is a electron cyclotron resonance chemical vapor deposition (ECRCVD).

3. The method for preparing the low k material film according to claim 1, wherein the plasma generating reaction system is an atom layer deposition (ALD) system.

4. The method for preparing the low k material film according to claim 1, wherein the step of converting of the silicon dioxide precursor comprising carbon and fluorine further comprises:
   stopping the introducing of the carrier gas into the plasma generating reaction system;
   introducing a temper gas into the plasma generating reaction system has at a flow rate ranging from 0.1 to 10000 sccm; and
   heating to a third temperature ranging from 300 to 550° C., so that a high carbon-fluorine ratio is maintained in the low k material film;
   wherein the temper gas is one selected from the group consisting of nitrogen, hydrogen, oxygen, fluorinated ammonia, silane vapor, helium and argon.

5. The method for preparing the low k material film according to claim 1, wherein an additional energy by using infrared system is applied in the step of converting the silicon dioxide precursor comprising carbon and fluorine into the low k material film.

6. The method for preparing the low k material film according to claim 1, wherein an additional energy by using laser system is applied in the step of converting the silicon dioxide precursor comprising carbon and fluorine into a low k material film.

7. The method for preparing the low k material film according to claim 1, wherein when the temper gas is introduced into the plasma generating reaction system, the introducing the carrier gas into the plasma generating reaction system is stopped.

8. The method for preparing the low k material film according to claim 1, wherein a dielectric constant of the low k material film ranges from 2.2 to 2.8.

9. A method for preparing a low dielectric constant (low k) material film, comprising:
   putting a substrate into a plasma generating reaction system, wherein a first temperature in the plasma generating reaction system ranges from 100 to 300° C.;
   heating a single silicon dioxide precursor comprising carbon and fluorine disposed in an evaporator to a second temperature ranging from 50 to 100° C. to be a gaseous phase with a vapor pressure in the range of 30 to 80 torr;
   introducing a carrier gas, carrying the single silicon dioxide precursor comprising carbon and fluorine alone, into the plasma generating reaction system, and forming silicon dioxide precursor comprising carbon and fluorine on the substrate, wherein the carrier gas is one selected from oxygen and argon; and
   introducing a temper gas into the plasma generating reaction system with a third temperature ranging from 300 to 550° C. to convert the silicon dioxide precursor comprising carbon and fluorine into a low k material film with fluorocarbon long chains consisting of a C—$F_x$ bond and to eliminate a stress of the low k material film, so that the low k material film has a compact structure;
   wherein silicon dioxide precursor comprising carbon and fluorine is $R_1Si(OR_2)(OR_3)(OR_4)$, tridecafluoro-1,1,2,2-tetrahydrooctyl-triethoxysilane (TDF-TEOS), and trimethoxy (3,3,3-trifluoropropyl) silane, in which $R_1$ is one of fluoroalkyl, fluoroalkenyl, fluoroalkynyl and fluoroaryl, and $R_2$, $R_3$ and $R_4$ are one of alkyl, methyl, ethyl, aryl, alkenyl and alkynyl;
   a carbon atom ratio content of the low k material film ranges from 10 to 50% and a fluorine atom ratio content ranges from 10 to 40%.

* * * * *